(12) United States Patent
Chen

(10) Patent No.: US 6,621,727 B2
(45) Date of Patent: Sep. 16, 2003

(54) THREE-TRANSISTOR SRAM DEVICE

(76) Inventor: Kuo-Tso Chen, 1F, No. 70-1, Jinhua Street, Daan Chiu, Taipei (TW)

( * ) Notice: Subject to any disclaimer, the term of this patent is extended or adjusted under 35 U.S.C. 154(b) by 49 days.

(21) Appl. No.: 10/038,308

(22) Filed: Jan. 4, 2002

(65) Prior Publication Data

US 2003/0128575 A1 Jul. 10, 2003

(51) Int. Cl.[7] .............................................. G11C 11/00
(52) U.S. Cl. .................... 365/154; 365/156; 365/185.07
(58) Field of Search ................................. 365/154, 156, 365/185.07, 189.05, 189.09, 205, 226

(56) References Cited

U.S. PATENT DOCUMENTS

| | | | |
|---|---|---|---|
| 5,046,044 A | * 9/1991 | Houston et al. | ............ 365/156 |
| 5,838,606 A | 11/1998 | Blankenship et al. | ........ 365/156 |
| 5,907,502 A | * 5/1999 | Kim | ............................ 365/156 |
| 6,285,578 B1 | * 9/2001 | Huang | ......................... 365/154 |
| 6,373,745 B2 | * 4/2002 | Saito et al. | .................. 365/174 |

* cited by examiner

*Primary Examiner*—David Nelms
*Assistant Examiner*—Gene N. Auduong

(57) ABSTRACT

A three-transistor SRAM device are disclosed. The SRAM device has an NMOS with its source connected to a first voltage source and its substrate connected to a second voltage source. The source of the NMOS is connected either a constant voltage source or a variable voltage source. An PMOS and the NMOS form a common node A. The drain of the NPMOS is connected to the source of the PMOS to form a common node B. A resister is connected between the nodes A and B. Another NMOS is connected between the node B and a bit line. The gate of this NMOS is controlled by a word line. A capacitor type amplifier may be further connected to the node B to form the data latch of the SRAM.

49 Claims, 15 Drawing Sheets

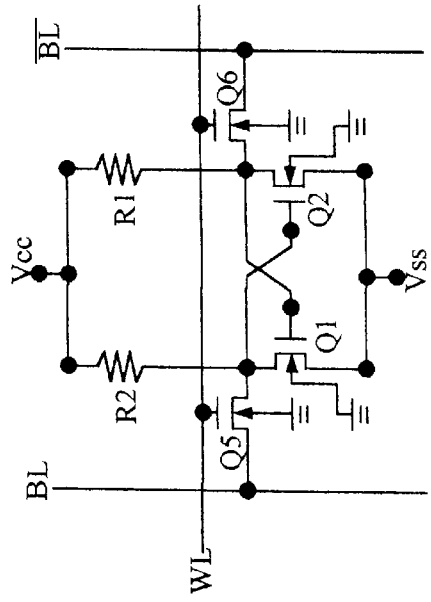
Fig 1 (a)
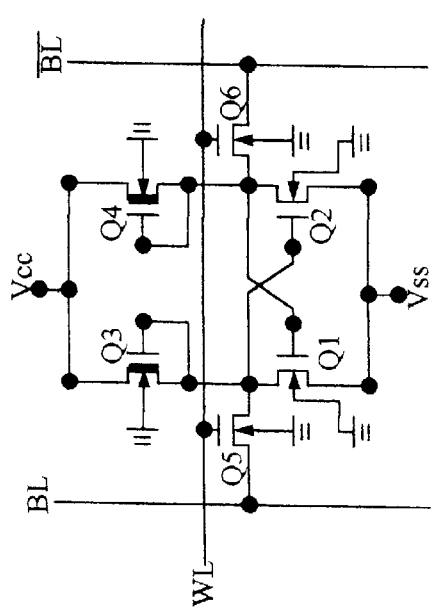
Fig. 1 (b)
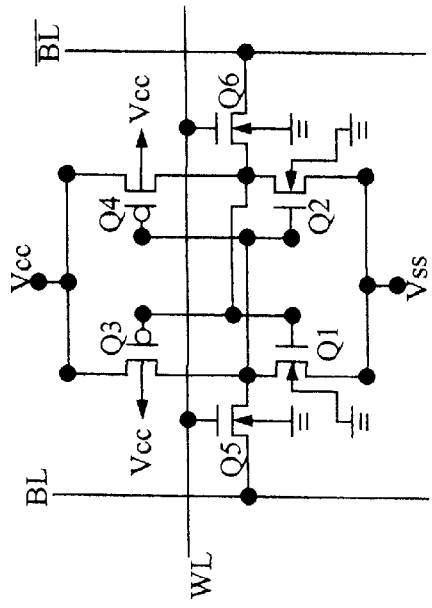
Fig 1 (c)
Fig.1

Fig. 4(a) While $V_A > \frac{1}{2}Vcc$

Fig. 4(b) While $V_A < \frac{1}{2}Vcc$

Fig. 5 (a) General Type.

Fig. 5 (b) With floating plate

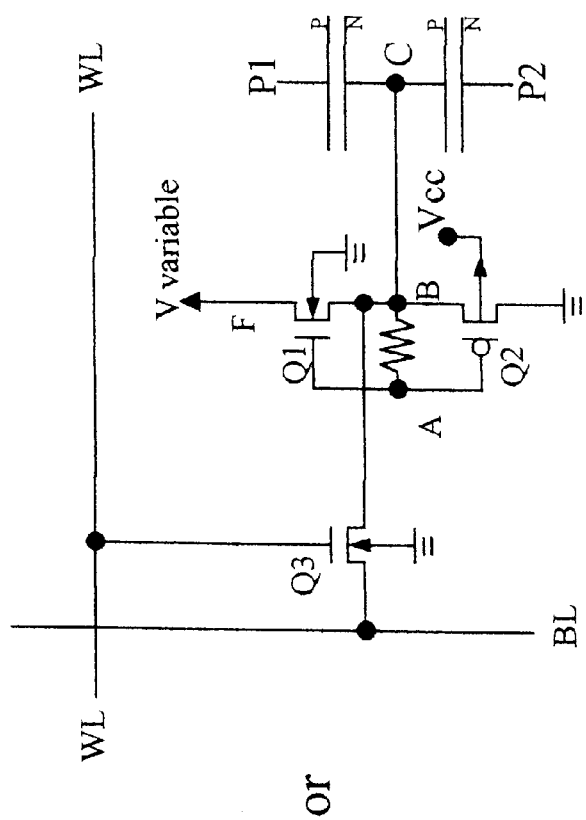
Fig. 8 (b)
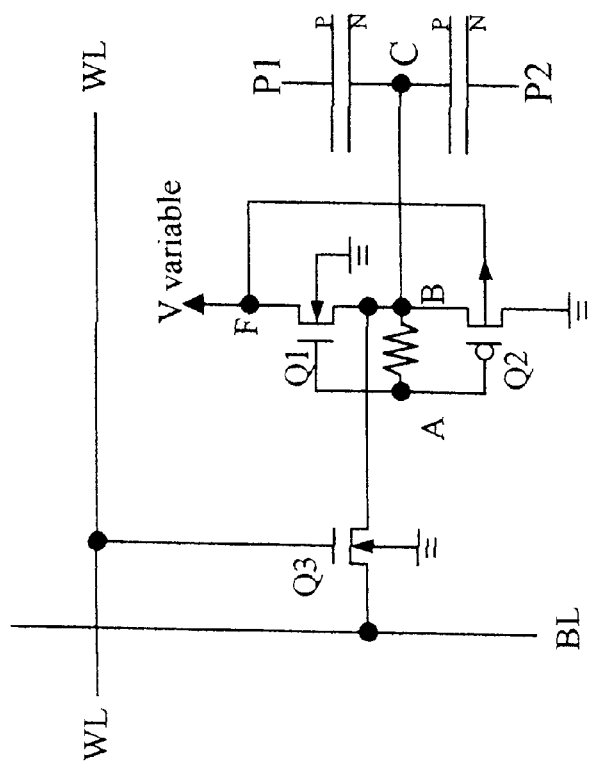
Fig. 8 (a)
Fig. 8

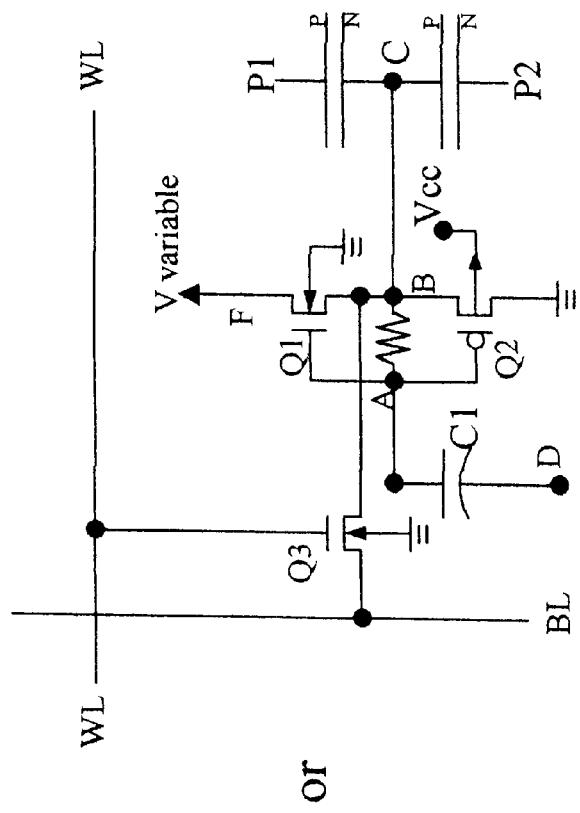
Fig. 9 (b)
or
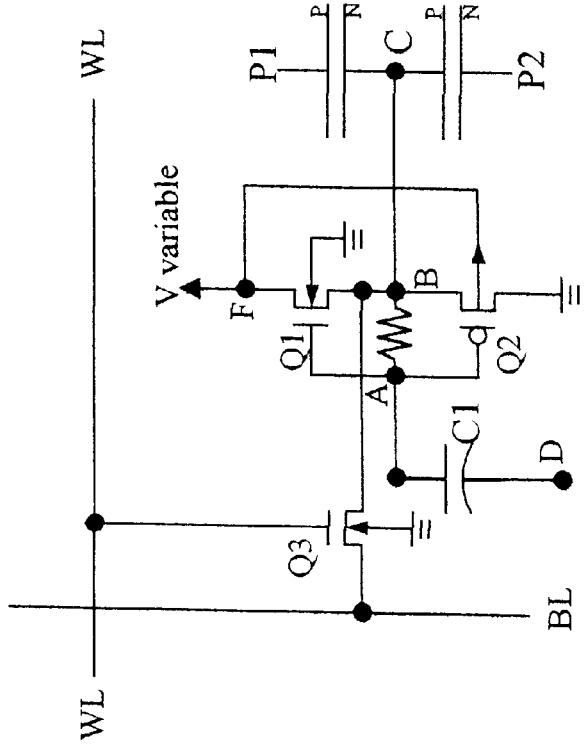
Fig. 9 (a)
Fig.9

Fig. 10 (b) Q3 in n-type; $V_F \ll V_{cc}$.

Fig. 10 (a) Q3 in p-type; $V_F \ll V_{cc}$.

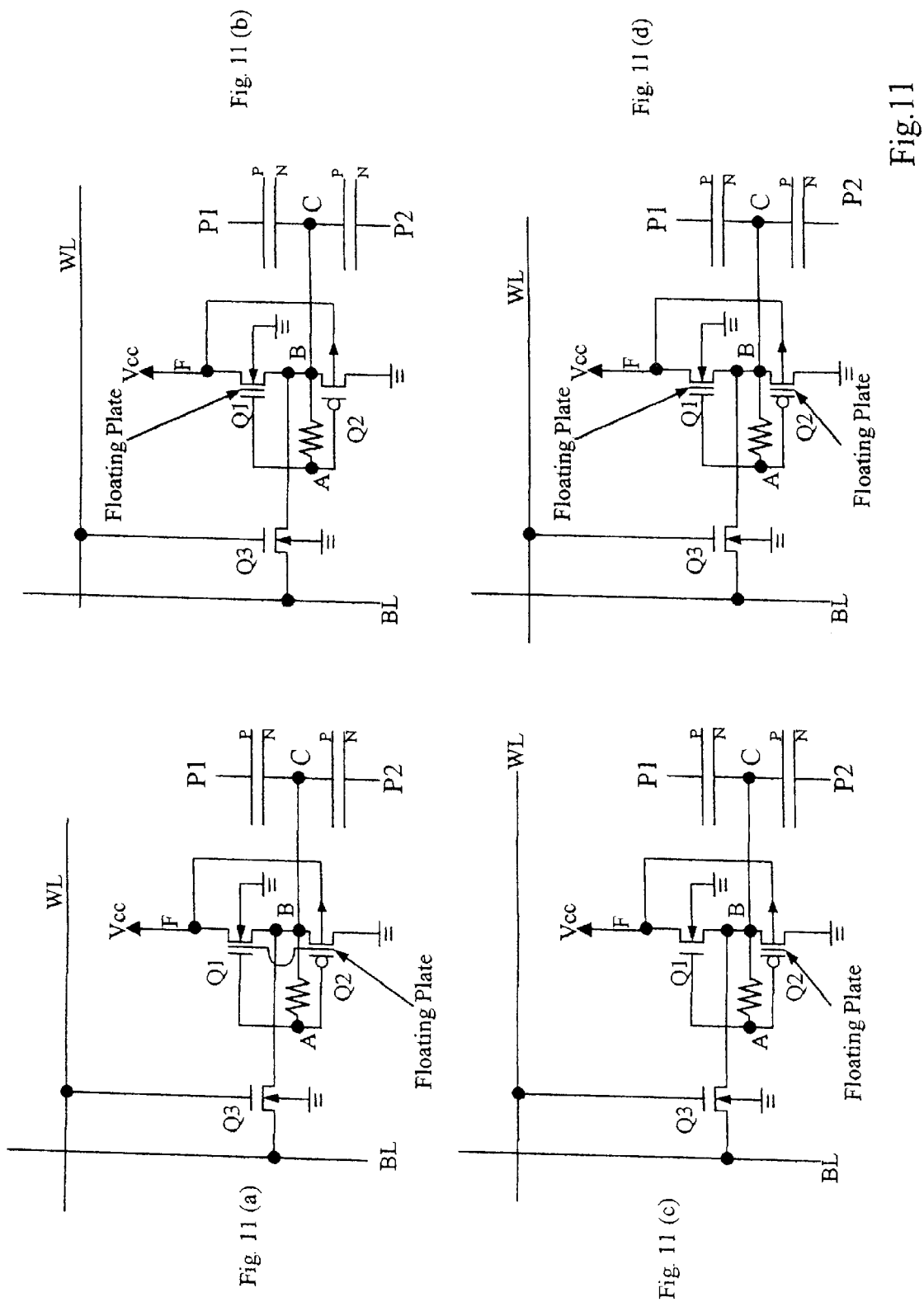

Fig. 12 (a) Charge driving with high voltage latch condition. ($V_A = V_F$).

Fig. 12 (b) Charge driving with low voltage latch condition. ($V_A = GND = 0V$).

→ : electric field $e^-$ : electron (negative charge).

THREE-TRANSISTOR SRAM DEVICE

RELATED FIELD

The present invention relates to Static Random-Access Memories (SRAM), which can typically be found in personal computers or portable electronics systems.

ART BACKGROUND

Modern computer memories are typically built with several types of chips, all of which have different properties. One of the memory types is Dynamic Random-Access Memories (DRAMs). DRAMs have the highest number of bits/chip (highest memory bit density), but with the disadvantage that they have to be "refreshed" in order not to lose their information, which is stored in a capacitor.

Another memory type is Static Random-Access Memories. SRAMs store the information in latches. Although they take more silicon area per bit than DRAMs, they have the advantage that they do not require to be refreshed. Since SRAMs store their information in latches, it always takes shorter read/write time than DRAMs.

A book by A. J. van de Goor, entitled TESTING SEMICONDUCTOR MEMORIES THEORY AND PRATICE, 1991, by John Wiley & Sons Ltd., England, provides ample background information about the computer memories such as DRAMs and SRAMs. This book is incorporated herein by this reference as though fully set forth herein.

There are generally three types of SRAM cell structures, as will be described below in connection with FIGS. 1(a)–(c). FIG. 2 provides a listing of symbols as commonly used by those skilled in the art of semiconductor devices.

A six-device SRAM cell is shown in FIG. 1(a). It consists of the enhancement-mode NMOS transistors Q1, Q2, Q5 and Q6; and the depletion-mode NMOS transistors Q3 and Q4. Transistor Q1 forms an inverter together with depletion-mode NMOS transistor Q3. This inverter is cross-coupled with an inverter formed by Q2 and Q4, thus forming a latch. This latch can be accessed, for read and write operations, via the pass transistors Q5 and Q6.

Addressing of cells is done using a two-dimensional addressing scheme consisting of a row and a column address. A row decoder (not shown) allows only one row of cells to be selected at a time by activating the word line (WL) of that particular row. Note that within the chip, a memory word is synonymous with a row. The WL is connected to all gates of the pass transistors of all cells in that row, and only one WL should be active at a time. The selection of a particular cell in a row is done under control of a column decoder (not shown), which activates the set of complementary bit lines (BLs) of that particular cell.

Data can be written by driving WL high and driving the lines BL and $\overline{BL}$ with data with complementary values. Because the bit lines are driven with more force than the force with which the cell retains its information (the transistors driving the line BL and $\overline{BL}$ are more powerful, i.e. they are larger than the transistors Q1 and Q2), the cell will be forced to the state presented on the lines BL and $\overline{BL}$. In the case of a read operation, a particular row is selected by activating the corresponding WL. The contents of the cell on a row, accessed by the activated WL, are passed to the corresponding sense amplifiers via the BL and $\overline{BL}$ lines. A data register can be loaded by selecting the outputs of the desired sense amplifiers under control of the column decoder.

As shown in FIG. 1(b), the depletion loads Q3 and Q4 of FIG. 1(a) have been replaced with resistors R1 and R2 in order to decrease silicon area usage and power dissipation of the cell. The resistors are made from polysilicon with a high resistivity, e.g. having a value of 1000GΩ, causing an asymmetry in the logic "1" and "0" drive power of the latch. A logic "0" level is caused by a conducting transistor (Q1 or Q2) which allows for a relatively low ohmic path. A logic "1" level is caused by a non-conducting transistor (Q2 or Q1) and has to be maintained by the high ohmic polysilicon resistor, which is dimensioned such that it will be able to supply the relatively small leakage current of the non-conducting transistor (Q2 or Q1).

As shown in FIG. 1(c), the load devices of FIG. 1(a) have been replaced with PMOS enhancement mode transistors Q3 and Q4. This complementary use of both PMOS and NMOS transistors, commonly referred to as "CMOS," further reduces the power requirements of the cell; except for some small leakage current, no power will be dissipated during the time the cell retains the stored logic value. The disadvantage of CMOS technology is that it requires more processing steps because of the presence of both NMOS and PMOS transistors.

While SRAMs have certain advantages over DRAMs in terms of having quicker access without the need to refresh, SRAMs generally require larger chip area than DRAMs. For example, one of the disadvantages of the circuit shown in FIG. 1(c) is that the chip area ends up having too many transistors. As shown in FIG. 1(c), 6 transistors are required in one cell design, especially with both P-type and N-type transistors at same cell. Under the CMOS design methodology, as is well known, to prevent "latch-up," which can burn out the devices, special "distance" and "isolation barrier" are required to separate the P-type transistors from the N-type transistors. Such distance and isolation barriers also require more chip space. While the circuit shown in FIG. 1(a) is implemented with 6 transistors, all of them are N-type. As such, the problem of "latch-up" is of little concern for the circuit of FIG. 1(a).

In FIG. 1(a), however, the circuit has other disadvantages. While in data latch, one of the depletion mode transistors (Q3 or Q4) with the latch-current forms a drain-to-source path. For example, while "drain" of Q1 is in condition "high", the "drain" of Q2 is in "low", and a latch current will flow from "drain" of Q4 ("high") to "source" of Q4 (i.e. "drain" of Q2 which is in "low"), and then flow through Q2 from "drain" to "source". As such, a constant supply current is required during the "stand by" condition. As such, the circuit of FIG. 1(a) also has the disadvantages of requiring a large chip area and requiring large power consumption.

The circuit in FIG. 1(b) is implemented with only 4 transistors in one cell, thus requiring smaller chip area. However, the resistors R1 and R2 will limit the current from Vcc to BL and $\overline{BL}$, and lower the sensitivity, as well as require more time to "read". Also one of the resistors (R1 or R2) with the latch-current during the stand by condition. For example, while the drain of Q1 is High, the drain of Q2 will be Low under latch occurrence. However, a stand-by current will flow from Vcc through R1 to the drain of Q2, and then flow through Q2 from drain to source which is Vss. The stand-by current will also cause power loss. Therefore, the circuit of FIG. 1(b) still suffers from having lower read speed and lower read sensitivity, while still requiring large power consumption.

SUMMARY OF THE DISCLOSURE

Therefore, it is an object of the present invention to provide an SRAM cell with smaller chip area.

It is also an object of the present invention to provide an SRAM cell with more stabilized latch point voltage during date read operation.

It is yet another object of the present invention to provide an SRAM cell with lower power loss during write operation.

It is yet another object of the present invention to provide an SRAM cell which can retain data even when the power is turned off.

A three-transistor SRAM cell is disclosed. The SRAM cell has an NMOS with its source connected to a first voltage source and its substrate connected to a second voltage source. The drain of the NMOS is connected either a constant voltage source or a variable voltage source. An PMOS and the NMOS form a common node A. The source of the NMOS is connected to the source of the PMOS to form a common node B. A resister is connected between the nodes A and B. Another NMOS is connected between the node B and a bit line. The gate of this NMOS is controlled by a word line. A capacitor type amplifier is connected to the node B.

Another aspect of the present invention is an SRAM cell with a capacitor connected to the latch point to stabilize the voltage during date read operation. The capacitor serves to prevent noise that may cause data loss during data read.

Yet another aspect of the present invention is an SRAM cell with a variable voltage source as its latch voltage High. The variable voltage serves to lower the voltage during write operation to reduce power loss.

Another aspect of the present invention is an SRAM cell with multiple bit lines and multiple word lines for read and write operations.

A further aspect of the present invention is an SRAM cell which is nonvolatile by use of a floating plate at the MOSFET's gates.

In accordance with one embodiment of the present invention, a resistor is used to provide a bias for the gate relative to the source, and a capacitor-type amplifier is used to pump the charge. Under a proper arrangement of the resistor and pumping time sequence, the charge for forming the latch could be driven to capacitor type amplifier first, and then be driven to back to node A. While both the N-type transistor and P-type transistor are implemented in the same cell, the Vcc/high latch voltage is connected to the drain of NMOS, and the ground/low latch voltage is connected to the drain of PMOS, thus avoiding the problem of latch-up.

In accordance with another embodiment of the present invention, the PMOS and NMOS devices can be combined to form a single-gate CMOS device. The single-gate device is formed by burying the drain of the NMOS under the gate of the PMOS, and working it as the substrate of the PMOS, while also burying the drain of the PMOS under the gate of the NMOS, and working it as the substrate of the NMOS. When implementing the single-gate CMOS device on STI ("shallow trench isolation") site, the total chip area of the device is almost equal to the chip area of a MOSFET.

BRIEF DESCRIPTION OF THE DRAWINGS

The objects, features and advantages of the present invention will become apparent from the following description, wherein:

FIGS. 1(a)–(c) illustrate conventional SRAM cell structures.

FIG. 4(a) shows the flow when $V_A > \frac{1}{2}$ Vcc. FIG. 4(b) shows the flow when $V_A < \frac{1}{2}$ Vcc. FIG. 4(c) shows the timing diagram of voltages at P1 and P2.

FIG. 5(a) illustrates a general type of twin gate. FIG. 5(b) illustrates a twin gate with a floating plate in the gate. FIG. 5(c) illustrates the charging and discharging of the floating plate.

FIGS. 8(a)–(b) illustrate yet another embodiment of the present invention of FIG. 3 with variable high latch voltage.

FIGS. 9(a)–(b) illustrate another embodiment of the present invention of FIG. 3 with variable high latch voltage and capacitors at latch points.

FIGS. 12(a)–(b) illustrate charges being driven in.

DETAILED DESCRIPTION OF THE PREFERRED EMBODIMENT

A three-transistor SRAM cell for memory devices is disclosed. In the following description, numerous specific details are set forth, such as voltage levels, polarities, p- or n- wafers, types and modes of transistors, etc., in order to provide a thorough understanding of the present invention. It should be understood, however, by those skilled in the art that these details are not required to practice the present invention. In other instances, well-known circuits, methods and the like are not set forth in detail to avoid unnecessarily obscuring the present invention.

Figure 2:
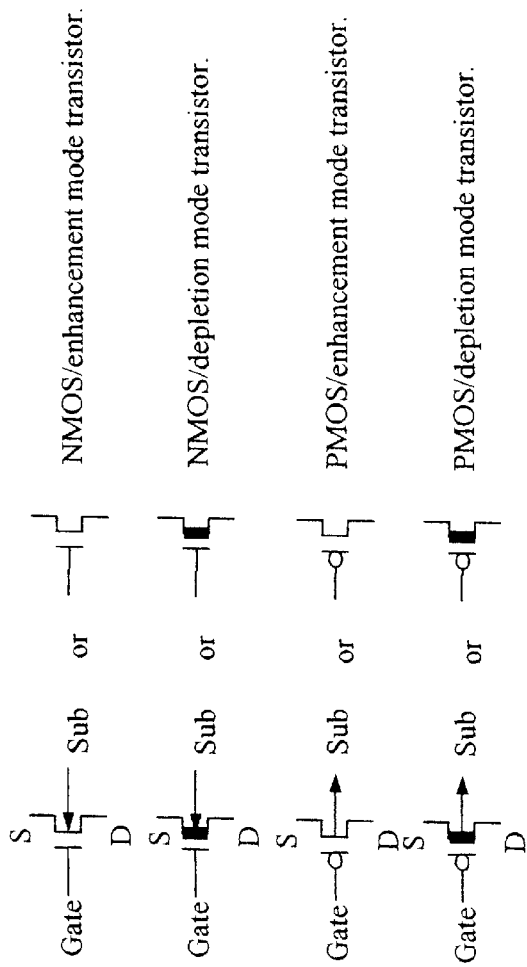
FIG. 2 is a listing of commonly used symbols for MOSFET devices.
Figure 3:
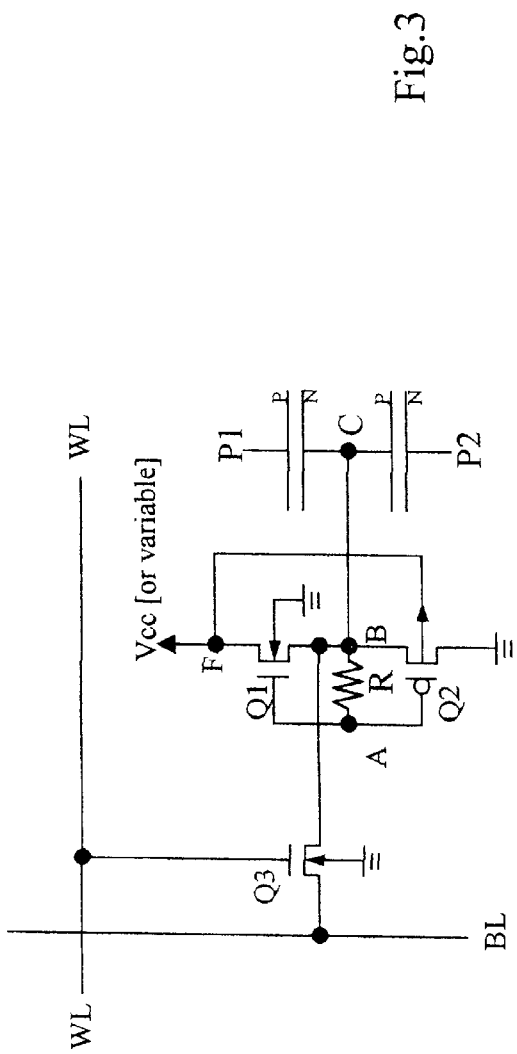
FIG. 3 illustrates a 3-transistor (3T) SRAM cell of the present invention for p-type wafer.

FIG. 3 illustrates a first embodiment of the present invention, where a 3-transistor SRAM cell circuit, currently in p-type wafer, is shown. Here, the drain of NMOS Q1 and the substrate of PMOS Q2 are connected to $V_{cc}$ at node F. The drain of PMOS Q2 is connected to ground. The substrate of NMOS Q1 is connected to ground. The source of NMOS Q1 and the source of PMOS Q2 are connected at node B. A resistor R is connected from the common sources of NMOS Q1 and PMOS Q2 at node B to the common gates of NMOS Q1 and PMOS Q2 at node A. The common sources at node B is connected to node C between two polysilicon-type capacitors, which is connected in series between voltages P1 and P2.

As can be appreciated by those skilled in the art, by placing the NMOS and PMOS devices together, the problem of latch-up is minimized or entirely avoided Also, by separating the latch node to two at the node of gates (node A) and the node of sources (node B), pre-charging occurs at the node of sources, and latch voltage occurs at the node of gates. A "capacitor-type amplifier" can thus be implemented, without transistors, for charge pumping from the node of sources to the node of gates. As such, the device in accordance with the present invention requires relatively smaller chip area since it requires a chip area of only 2 transistors.

One of the polysilicon-type capacitors is connected to node C by its n-type pole, while its p-type pole is connected to voltage source P1. Another polysilicon-type capacitor is connected to node C by its p-type pole, while its n-type pole is connected to voltage source P2. The polysilicon-type capacitors thus connected form a capacitor-type amplifier, and the gain of the amplifier is controlled by the voltage sources P1 and P2.

A storage node is thus formed by node B and node C, and is further connected to the one of the source/drain terminals of the pass transistor MOSFET Q3. The other one of the source/drain terminals of MOSFET Q3 is connected to the Bit Line (BL), while the gate of MOSFET Q3 is connected to the Word Line (WL).

Figure 14:
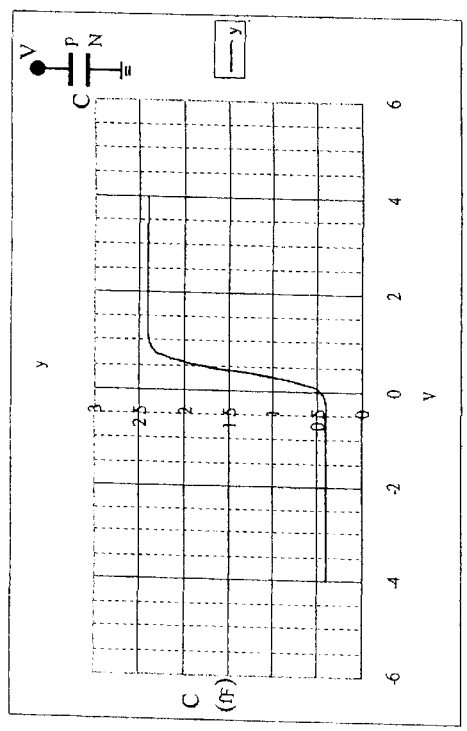
FIG. 14 illustrates a capacitance vs. voltage (CV) curve for a conventional small capacitor.

Reference is now directed to the operation of the capacitor-type amplifier of FIG. 3. Referring to FIG. 14, it illustrates the high-frequency characteristic curve for a conventional semiconductor-type capacitor with P-poly/Oxide/N-sub structure. When the voltage at P-type node is positively biased, the capacitance is at high level. When the voltage at P-type node is negatively biased, the capacitance is low. By combine two P-poly/Oxide/N-substrate-type capacitors, a capacitor-type amplifier can be formed as will be described in connection with FIG. 15.

Figure 15:
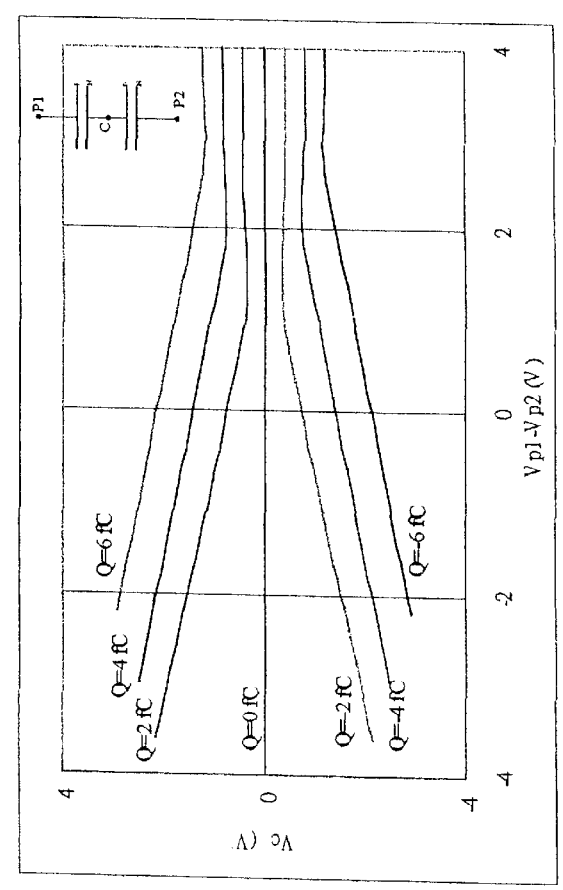
FIG. 15 illustrates the values of the voltage at node C as the charges at node C varies, where node C is the node between the two in-series capacitors.

In contrast to the characteristics of a conventional capacitor as shown in FIG. 14, FIG. 15 shows that by keeping center voltage between P1 and P2 unchanged, i.e. keeping ½(V(p1)+V(p2))=constant=0V, the equivalent circuit of the capacitor-type amplifier behaves just like a variable capacitor. The capacitor-type amplifier will achieve high capacitance value while P1 has a high voltage and P2 has a low voltage. The capacitor-type amplifier will achieve low capacitance value while P1 has a low voltage, and P2 has a high voltage. As can be appreciated by those skilled in the art, the voltage at node C, Vc (related to ½(V(p1)+V(p2))), is in inverse relationship with the capacitance value of node C. Therefore, while (V(p1)–Vp2) changes from positive to negative, with the total charge in node C remaining unchanged, the voltage Vc could be driven to even higher value, if the initial voltage of node C is higher than ½(V(p1)+V(p2)), which is Qc>0. The voltage Vc could be driven to even lower value, while the initial voltage of node C is lower than ½(V(p1)+V(p2)), which is Qc<0.

Figure 4C:
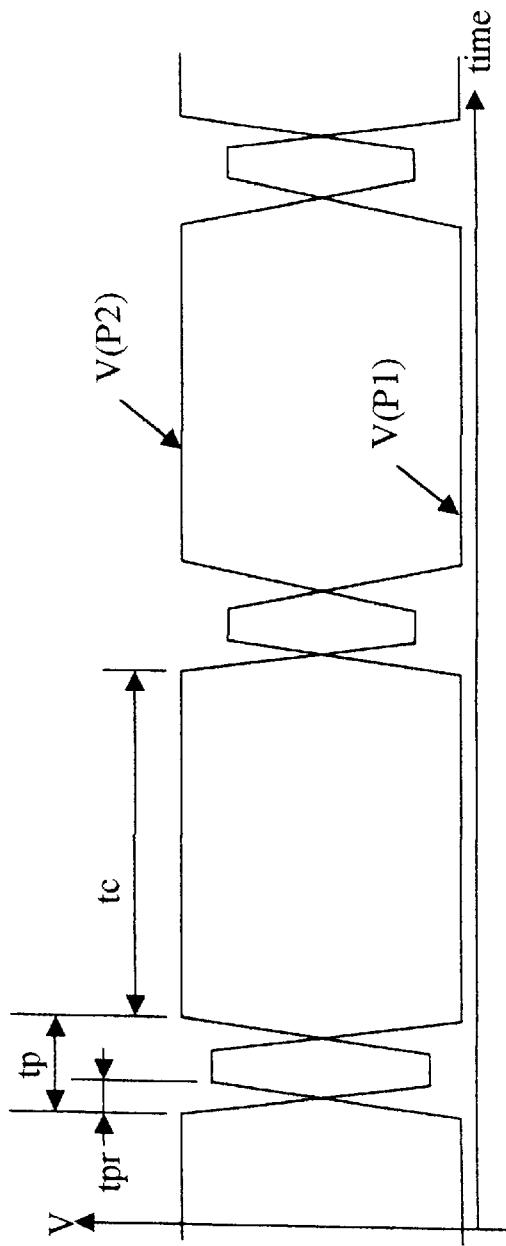
FIGS. 4(a)–(c) illustrate the pumping signals of the 3T SRAM of the present invention to charge the storage node A.
Figure 4:
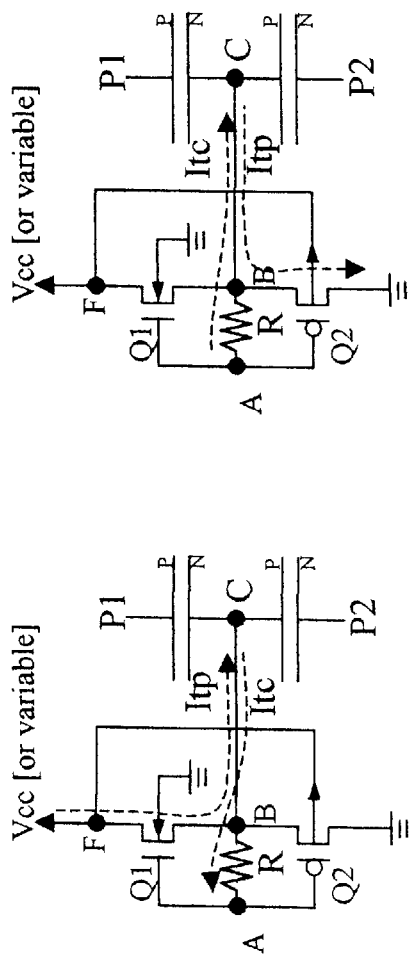

Reference is now back to FIGS. 4(a)–(c). FIGS. 4(a) and (b) illustrate the charge paths for different $V_A$ values. FIG. 4(c) illustrates a timing pulse diagram where the capacitors P1/C and C/P2 are used as the pumping circuit to charge node A. The voltages applied to nodes P1 and P2 are V(p1) and V(p2), respectively. The charge suck period is represented as "tp", and the rising time of 'tp' is 'tpr', where 'tpr' is <<RC, where R is the resistor R's value and C is the sum of parasitic capacitances of Q1 and Q2. The current drive period, tc, is usually >>RC. Also, ½(V(p1)+V(p2))=½ Vcc= constant.

During the 'tp' duration, the voltage of node C could be driven to very close to ½ Vcc, as shown in FIG. 15. While node A is in high voltage (where the initial charge in capacitor pair C/P1 and C/P2 is positive), during 'tp', the voltage of node A will be higher than node B, and Q1 will be turned 'ON', and a large current will flow from node F to node C, and pull the voltage of node C close to voltage of node A, and then, more positive charge will be kept in capacitor pair C/P1 and C/P2.

While node A is in low voltage (where the initial charge in capacitor pair C/P1 and C/P2 is negative), during 'tp', the voltage of node A will be lower than node B, and Q2 will be turned 'ON', and a large current will flow from node C to ground, and pull the voltage of node C close to voltage of node A, and then, more negative charge will be kept in capacitor pair C/P1 and C/P2. The rising time of purse 'tpr' should be shortened to make the voltage difference of node A and node B larger than the threshold voltage of either Q1 or Q2.

During the 'tc' duration, the voltage of node C could be driven to far from ½ Vcc, as previously shown in FIG. 15. While node A is in high voltage, during 'tc', the voltage of node B will be higher than node A, some charge will be lost while VB>VA+Vth, where Vth is the threshold voltage of Q2. Some charges also take time to flow from node B to node A by passing through the resistor R. And if the capacitance of capacitor pair C/P1 and C/P2 is much larger than the parasitic capacitances of Q1 and Q2, at the end of 'tc' the voltage of node could be nearly equal to (Vth of Q2)+(VA before 'tp'); and the maximum voltage of VA is nearly equal to (Vth of Q2)+Vcc after numbers of pumping cycles.

While node A is in low voltage, during 'tc', the voltage of node B will be lower than node A, some charge will be lost while VB<VA–Vth, where Vth is the threshold voltage of Q1. Also some charges take time to flow from node A to node B by passing through the resistor R. If the capacitance of capacitor pair C/P1 and C/P2 is much larger than the parasitic capacitances of Q1 and Q2, at the end of 'tc' the voltage of node could be nearly equal to (VA before 'tp')–(Vth of Q2); and the minimum voltage of VA is nearly equal to –(Vth of Q2). For making more charging efficiency, the 'tc' could be preferably designed under 'tc'>>RC.

Figure 6:
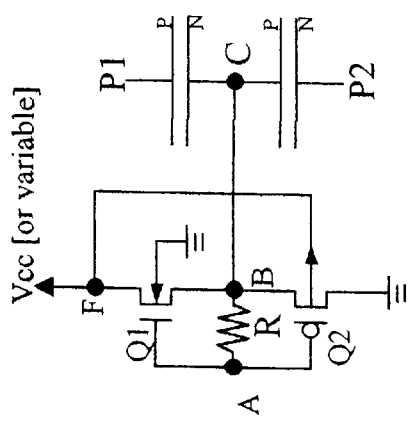
FIG. 6 illustrates an equivalent circuit of the SRAM cell of FIG. 3 while MOSFET Q3 is "OFF".

An equivalent circuit of the SRAM cell of FIG. 3 is shown in FIG. 6, when MOSFET Q3 is off. For example, with a typical gate oxide thickness of 6 nm, length of 0.3 $\mu$m, and width of 0.3 $\mu$m, the parasitic capacitance is roughly equal to 0.5 fF, i.e. $0.5 \times 10^{-15}$ F. The total capacitance at node A of the circuit in FIG. 6 is thus roughly equal to 1.0 fF. As can be appreciated by those skilled in the art, the total capacitance of a MOSFET will have an influence on the latch force and the speed of the MOSFET. In a conventional DRAM, the standard capacitance value of the capacitor in cell is roughly 10.0 fF, which is 10 times larger than the parasitic capacitance of MOSFET in accordance with the present invention. In addition to the reduction in capacitance, it's easy to build up capacitor pair C/P1 and C/P2 with much larger capacitance than the parasitic capacitances of Q1 and Q2. Therefore, as previously mentioned in connection with FIG. 15, the driving efficiency could be easily designed in 'high level'.

Figure 5:
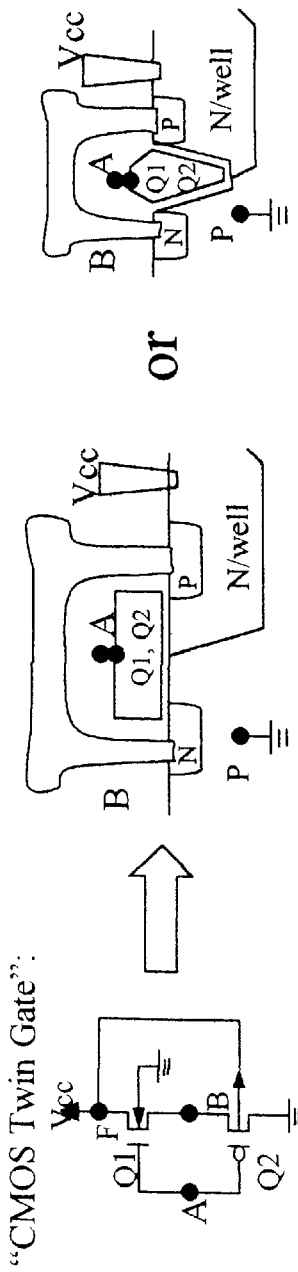
FIGS. 5(a)–(c) illustrate the structure of a "CMOS Twin Gate".
Figure 5:
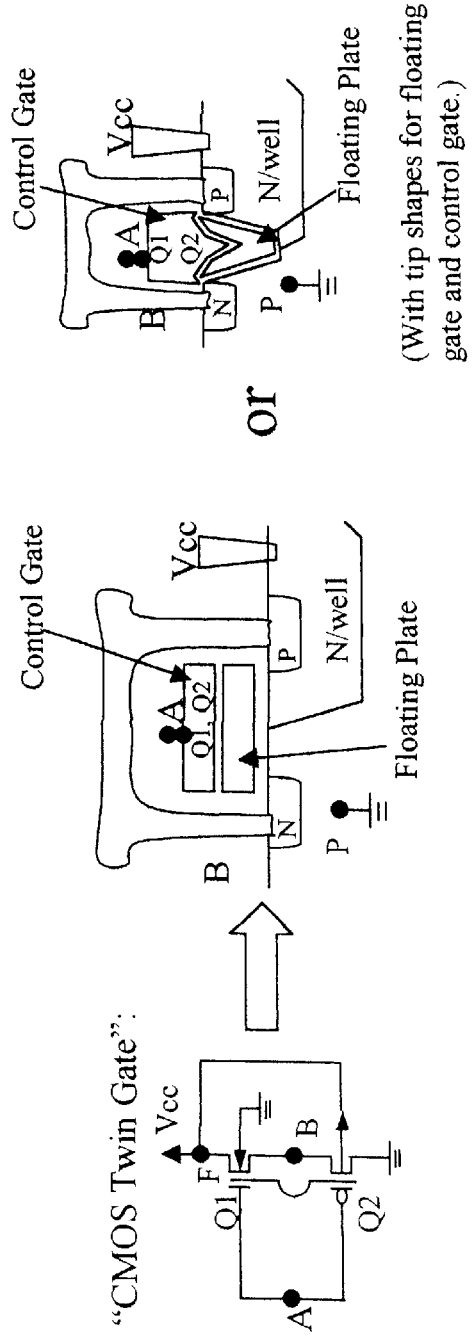
Figure 5:
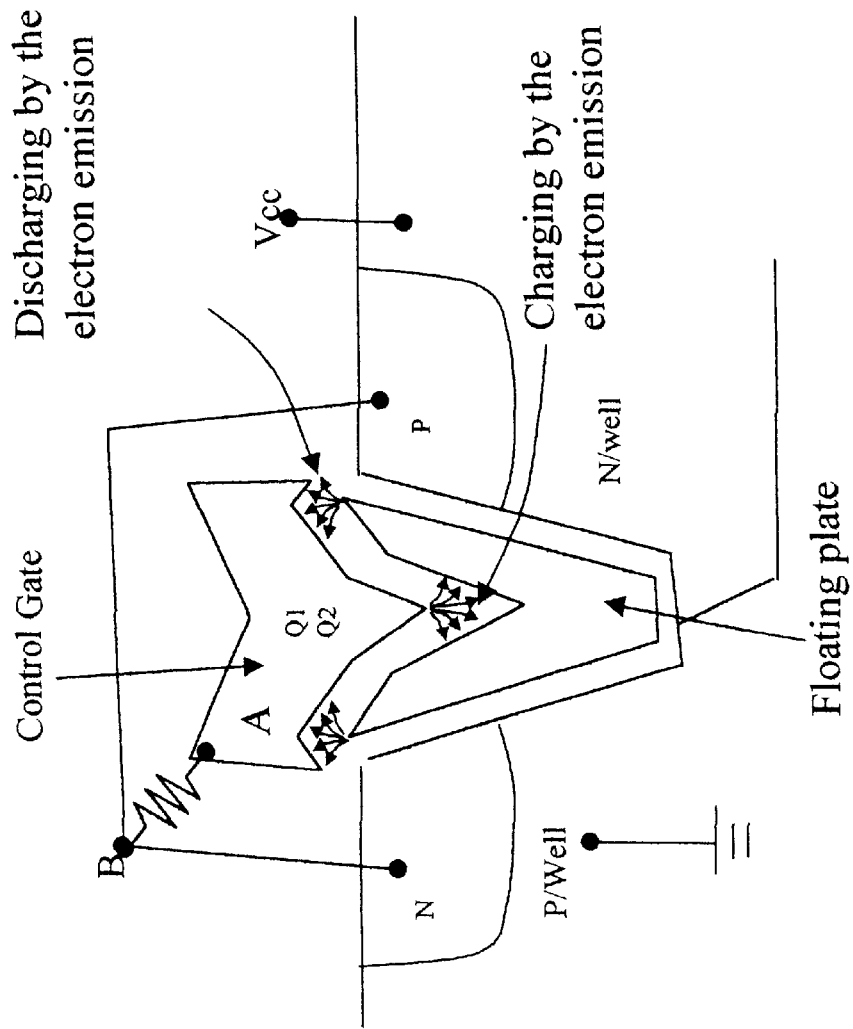

To further reduce chip area of the 3-transistor SRAM, if one combines the drain of Q1 and the substrate of Q2, and combines the drain of Q2 and the substrate of Q1, and combines both gates of Q1 and Q2, a new architecture design can be implemented, called "CMOS Twin Gate." FIGS. 5(a) and (b) illustrate the structures of the CMOS Twin Gate. The general type is shown in the central of FIG. 5(a), and the alternative type, which is built into the STI site, is shown in the right side of FIG. 5(a). Especially in CMOS products, the isolation should be implement to prevent latch-up. In accordance with the present invention, by adjusting the bias voltage at PMOS and NMOS, latch-up can be minimized or entirely avoided. Further, to build CMOS Twin Gate in STI site could shrink CMOS Twin Gate down to almost only one transistor chip area.

Further, another aspect of the present invention is the floating plate that can be built into the gate of "CMOS Twin Gate", a simplified drawing of which is shown in FIG. 5(b). The pointed-tip shape of the floating plate and gates is for charge transfer. The sharper the edge, the easier it is for electron emission from plates to plates. As can be appreciated by those skilled in the art, the CMOS twin gate can shrink the cell to a smaller chip area. Also, it would be easier to form the sharp edges at the floating plates and the control gates, thus making charging and discharging of the floating plate more under lower driving voltage, and also lower the power request for demand and discharging, as illustrated in FIG. 5(c).

Figure 7:
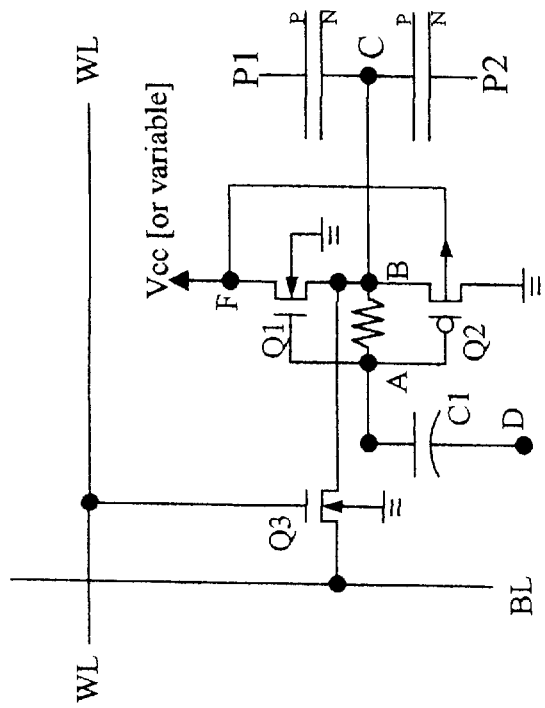
FIG. 7 illustrates one embodiment of the present invention of FIG. 3 with a capacitor at the latch point.

To further improve the performance of the basic 3T SRAM cell of the present invention, an additional capacitor device can be connected as shown in FIG. 7. Here, a capacitor C1 is connected to the latch point at node A or B to stabilize the voltage in Data Read procedure. The capacitor base voltage at point D may be made variable, during Write procedure, to lower power consumption, as well as improve reliability.

Also, since there may be some capacitance in Bit Line (BL), charges in the capacitor C1 will be shared with BL, thus pulling the voltage of BL closer to the 'Latch' level, while keeping the latch condition unchanged. As can be appreciated by those skilled in the art, in a latch condition, one of the MOS transistors Q1 or Q2 will keep the condition in an "ON" state. Current from BL, which is the current passing through pass transistor Q3, will be supplied by the current from Q1 or Q2.

The capacitor C1 serves to prevent the noise which may cause data loss during the Read procedure by stabilizing the voltage at latch point B. Typically, the capacitance of capacitor C1 may be 2 to 20 fF (~5 to 50 times higher than the parasitic capacitance of a typical MOSFET). In contrast to the conventional SRAM cells, e.g. the U.S. Pat. No. 5,838,606 issued to Blankenship, where charges are shared by the bit line capacitance, the cell in accordance with the present invention achieves higher latch-forming current (from ground to node B, or from node F to node B), and also with a current barrier resistor "R" which can prevent the voltage shift of node A during read, such that the latch condition is more stable and has better noise immunity.

Another embodiment to improve the performance of the basic 3T SRAM of the present invention is shown in FIGS. 8(a)–(b). Referring to FIGS. 8(a) and (b), a variable voltage source is used at node F ($V_F$) during a Write operation. This variable voltage $V_F$ has the effect of lowering the voltage at node F during a Write operation. While $V_F$ is lowered, with lower latch voltage at 'GND' to node F, the total power loss could be reduced during the Write operation.

Additionally, FIG. 8(b) illustrates an embodiment which can reduce power loss during a Write operation. Here, the drain terminal of NMOS Q1 is applied with a variable voltage source at node F during a Write operation, while the substrate of PMOS voltage Q2 is connected to Vcc. It should be noted that the variable voltage source is designed in so that it will be used while in "Short WL" or in "Graph Mode," where the whole page has been read or been written at a time. Also, some power may be lost when the voltage at node F is varied for cells that have not been through Read or Write operations. Therefore, to minimize power loss, it is preferable to apply the variable voltage source only for the cells in the Row or Column for Read/Write.

A combined approach, based on the embodiments shown in FIGS. 7 and 8, is illustrated in FIGS. 9(a) and (b). In FIG. 9(a), the drain terminal of NMOS Q1 and the substrate of PMOS Q2 are connected to the variable voltage source at node F. In FIG. 9(b), the drain terminal of NMOS Q1 is connected to the variable voltage at node F, while the substrate of PMOS Q2 is connected to a supply voltage Vcc. With reference to FIGS. 8(b) and 9(b), the circuits may also be constructed to have the drain of the NMOS Q1 connected to the variable voltage source during a Write operation, while the substrate of the PMOS Q2 is connected to $V_{cc}$.

Figure 13:
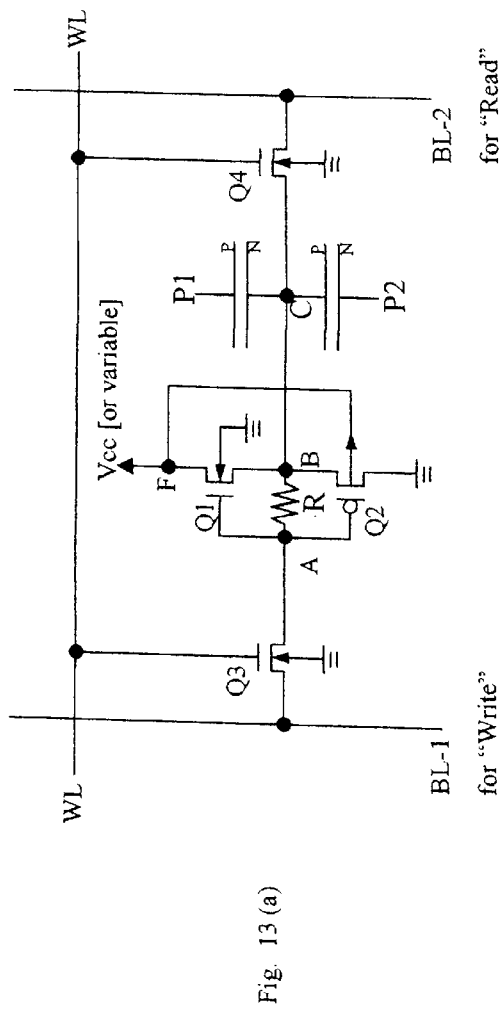
FIGS. 13(a)–(c) illustrate other embodiments of the present invention, as connected with Bit Lines and Word Lines.
Figure 13:
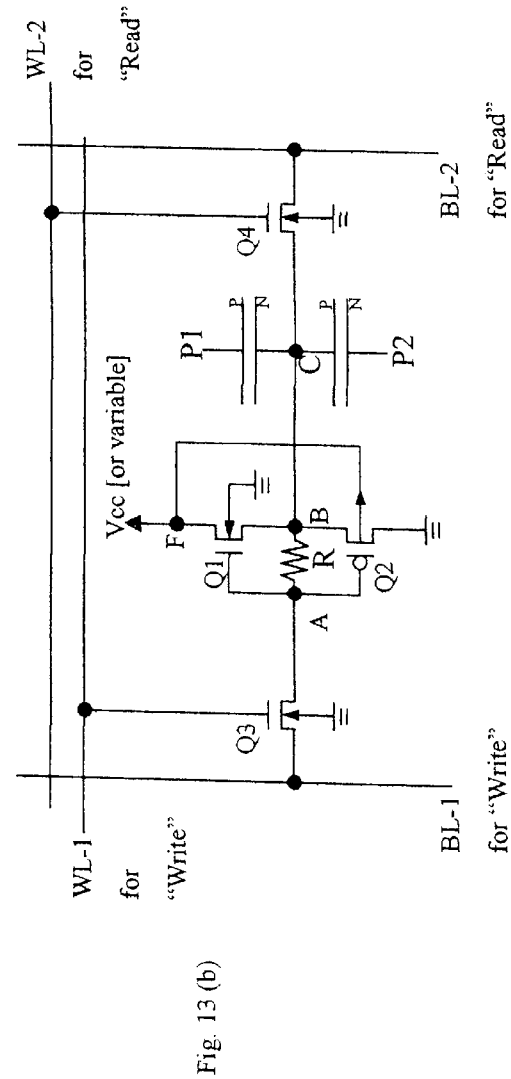
Figure 13C:
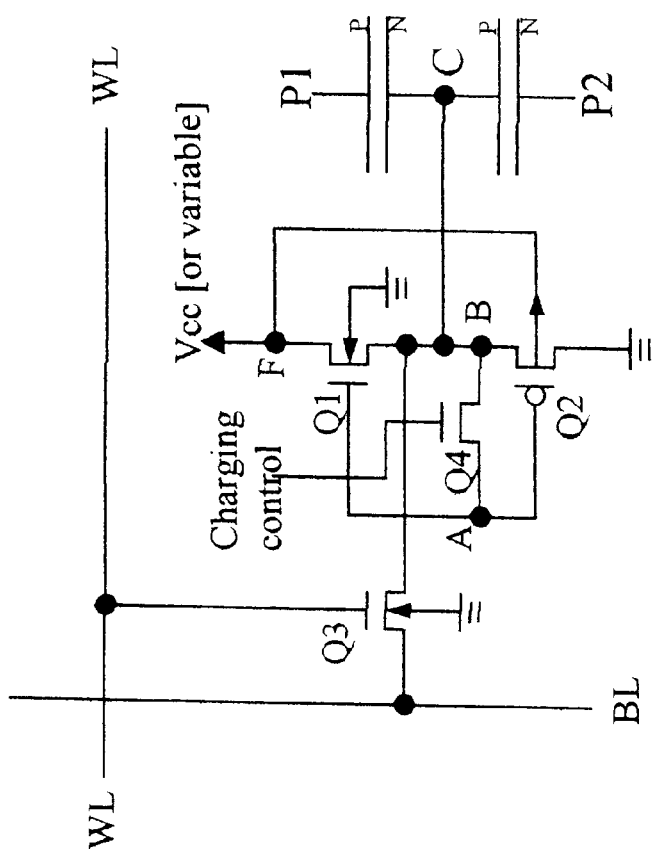

Referring to FIGS. 13(a)–(c), other embodiments of the basic 3T SRAM cells are illustrated. FIG. 13(a) illustrates multiple built-in Bit Lines, one for "read" operations and the other one for "write" operations. The "Bit Line for Read", BL-2, is connected to point B, which could support large current from Vcc or Ground to BL-2. The "Bit Line for Write", BL-1, is connected to node A, which could be "Write" in a very short time, for the "Charge for Write" is directly driven to the gates of NMOS Q1 and PMOS Q2. The same Word Line (WL) controls both pass transistors Q3 and Q4.

FIG. 13(b) illustrates an embodiment of the SRAM cell with multiple Bit Lines (BL) and Word Lines (WL) for read and write operations. WL-1 and BL-1 are for "write" operations by controlling the pass transistor Q3. WL-2 and BL-2 are for "read" operations, by controlling the pass transistor Q4. As can be appreciated by those skilled in the art, two bit lines can be useful in reducing the power consumption and speeding up the device in accordance with the present invention.

During 'writing', Q3 is 'ON', and the charge could easily flow through Q3 into node A, thus making the 'write' speed faster and reducing power loss. During 'reading', Q3 is 'OFF', and the current flows through Q4 to BL-2 as shown in FIG. 13. The 'read' and 'write' are in different logic operation, and can be readily controlled by different BL or WL. Further, a sense amplifier can be connected between the BL-1 and BL-2, where the input sense amplifier is connects to BL-2, and the output of sense amplifier is connected to BL-1. The latch can then be enhanced during 'read', and the operations of 2 BL circuit is substantially the same as 1 BL system.

FIG. 13(c) illustrates another embodiment of the SRAM cell of FIG. 3, where the resistor R connecting nodes A and B is now replaced by a MOSFET Q4. During charge pumping, the MOSFET Q4 is turned on to allow charges at node C drive into node A, in a write process. While in read, standby or charging at node C, the MOSFET Q4 is off, and large current could be supplied from Vcc or Ground to node B, without affecting the voltage at node A. Also, the MOSFET Q4 in FIG. 13(c) could be formed as a Thin Film Transistor to avoid having to use extra cell area.

Figure 10:
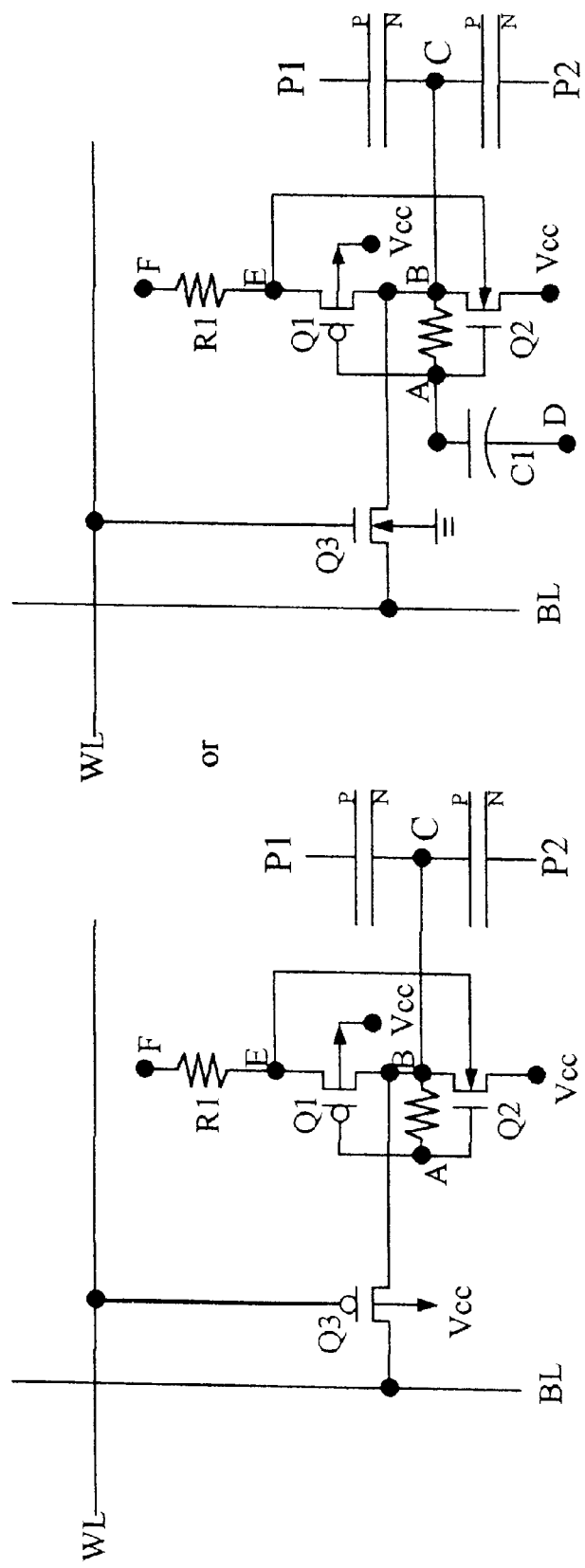
FIGS. 10(a)–(b) illustrate other embodiments of the SRAM cell circuit of FIG. 7 for n-type wafers.

In addition to p-type wafers, n-type wafers can also be used to implement the 3T SRAM cell of the present invention. FIGS. 10(a) and (b) illustrate other embodiments of the SRAM cell of FIG. 7 using n-type wafers, by setting the voltage at point F lower than GND(=0V). Here, in FIG. 10(a), the pass transistor Q3 is type MOSFET. Note that a resistor R1 is connected between node E and node F. FIG. 10(b) illustrates the pass transistor Q3 as an n-type MOSFET.

Non-volatile SRAM Cells. Another aspect of the present invention is a nonvolatile SRAM cell, which retains data contents even after power is turned off As can be appreciated by those skilled in the art, one of the disadvantages of SRAMs and DRAMs is that data are lost after power is turned off. EPROMs, EEPROMs, and Flash EEPROMs could retain the stored data even when power is turned off, although they take a long time to 'Write' or 'Erase' data to or from memories.

As shown in FIGS. 11(a)–(e), the SRAM cell of the present invention can achieve high-speed read/write, while maintaining data even after power is turned off, by connecting one or more floating plates to the latch point of each cell. For illustrative purposes, floating plates are applied to the circuits previously illustrated in FIG. 3 and FIG. 7, although it should be appreciated by those skilled in the art that SRAM cells based on different types of MOS transistors or wafers can readily be implemented in the same manner as well.

FIG. 11(a) illustrates an SRAM cell according to the basic cell of FIG. 3, but with floating plates at the gates of NMOS Q1 and PMOS Q2, where the floating plates of Q1 and Q2 are electrical connected. FIG. 11(b) illustrates an SRAM cell according to the cell of FIG. 3, with a floating plate at the gate of NMOS Q1. FIG. 11(c) illustrates an SRAM cell according to the cell of FIG. 3, but with a floating plate at the gate of PMOS Q2. FIG. 11(d) shows an SRAM cell according to the cell of FIG. 3, but with floating plates at the gates of NMOS Q1 and PMOS Q2, where the floating plates are independent from each other. FIG. 11(e) illustrates an embodiment of the SRAM cell according to the cell of FIG. 7, but with a floating plate at the capacitor C1.

Many types of conductive materials can be used as the floating plate material, although typically most integrated circuits use polysilicon material. Also the thin dielectric film between the floating plates and other conducting material is typically made by silicon dioxide ($SiO_2$) or ONO (oxide/nitride ($Si_3N_4$)/Oxide) film.

Figure 11:
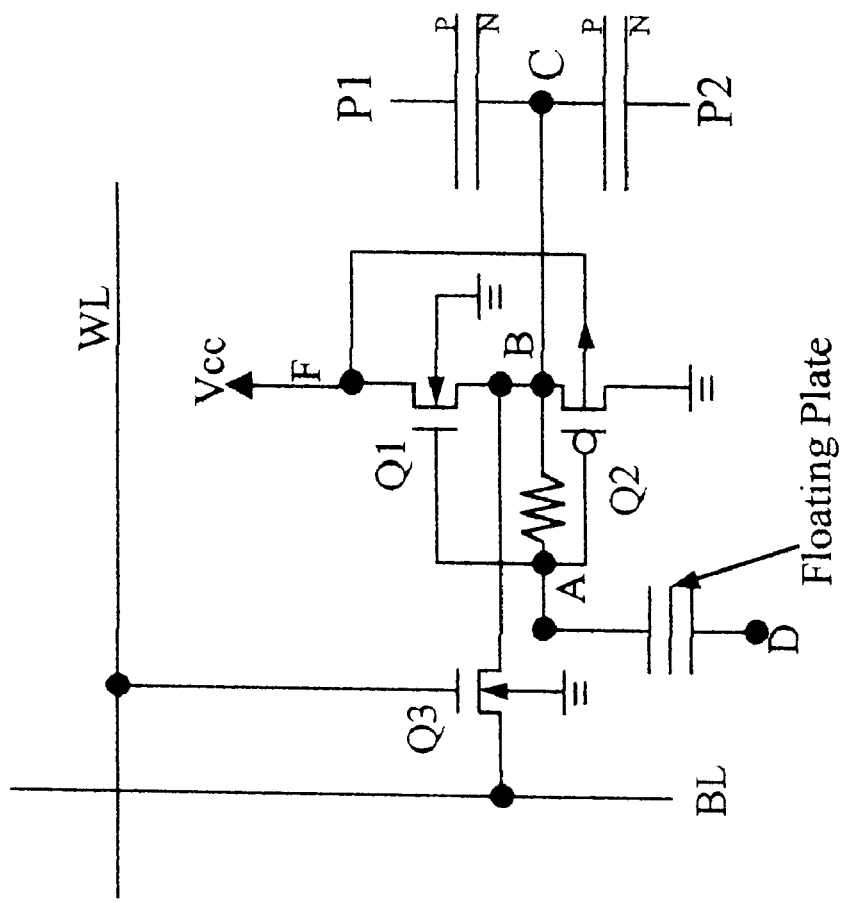
FIGS. 11(a)–(e) illustrate embodiments of non-volatile SRAMs of the present invention having floating plates to form nonvolatile cells.
Figure 12:
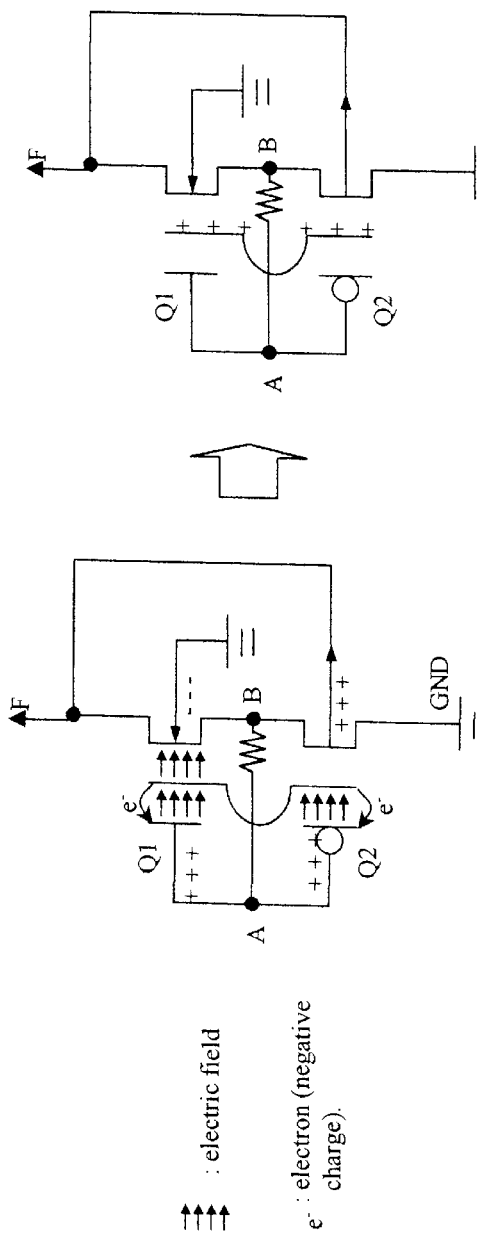
Figure 12:
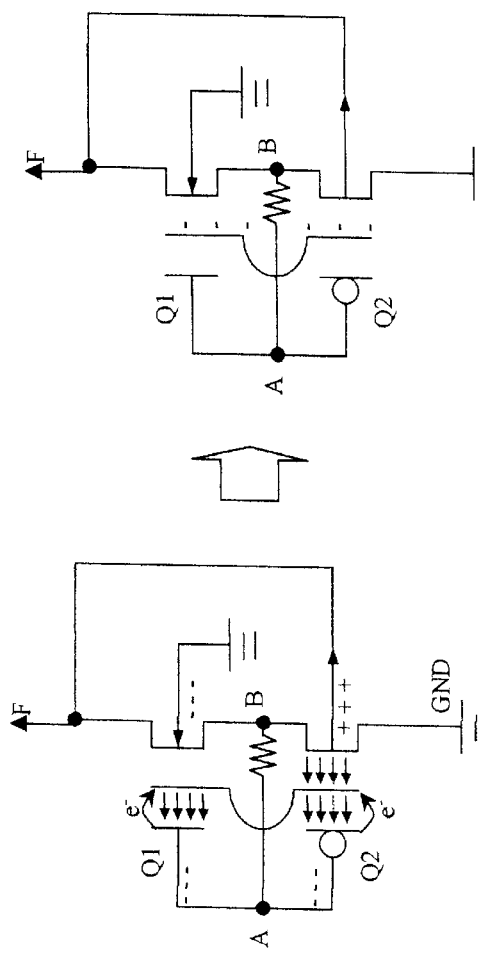

The mechanism of driving positive charges into the plate of FIG. 11 is illustrated in FIG. 12(a), and the mechanism of driving negative charges into the plate is illustrated in FIG. 12(b). When the voltage difference between node A to the floating plate is higher than the drive-in voltage, electrons will tunnel from the floating plate to the MOS gate at node A through the thin dielectric film, as illustrated in FIG. 12(a). Such tunneling will cause the floating gate to remain 'positive' charged. When the voltage difference between node A and the floating gate is lower than the negative drive-in voltage, the electrons will tunnel from MOS gate at node A to the floating plate through the thin dielectric film, as illustrated in FIG. 12(b). Such tunneling will cause the floating plate to remain 'negative' charged.

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention as defined in the following claims. In the claims, means-plus-function clauses are intended to cover the structures described herein as performing the recited function and not only structural equivalents but also equivalent structures.

What is claimed is:

1. A SRAM cell addressable by a word line and a bit line, comprising:
   a first MOSFET device of a first conductivity type substrate, having source, drain and gate terminals,
   wherein said source terminal is connected to a first voltage source,
   wherein said substrate is connected to a second voltage source;
   a second MOSFET device of a second conductivity type substrate, having source, drain and gate terminals,
   wherein the gate terminals of said first and second MOSFET devices is connected to form a common node A,
   wherein the drain terminal of the first MOSFET device and the source terminal of the second MOSFET device are connected to form a common node B;
   wherein the substrate of said second MOSFET device is connected to the first voltage source,
   wherein the drain terminal of said second MOSFET is connected to said second voltage source;
   a third MOSFET of said first conductive type substrate, having source, drain and gate terminals,
   wherein one of the source and drain terminals of said third MOSFET is connected to said node B,
   wherein the gate terminal of said third MOSFET is connected to said word line,
   wherein the other one of the source and drain terminals of said third MOSFET is connected to said bit line,
   wherein the substrate of said third MOSFET is connected to said second voltage source;
   a resister coupled between said node A and node B,
   wherein said resister has a predetermined resistive value R;
   a first capacitor,
   wherein one of said first capacitor's terminals is connected to a third voltage source P1,
   wherein the other one of its terminals is connected to said node B; and
   a second capacitor,
   wherein one of its terminals is connected to a fourth voltage source P2,
   wherein the other one of its terminals is connected to said node B.

2. The SRAM cell of claim 1, wherein said first voltage source is a variable voltage source.

3. The SRAM cell of claim 1, wherein said first voltage source is a constant voltage.

4. The SRAM cell of claim 3, wherein the gate terminals of said first and second MOSFET devices are formed by one common gate conducting material.

5. The SRAM cell of claim 3, further comprising a capacitor connecting between said node A and a fifth voltage source.

6. The SRAM cell of claim 4, wherein the gate terminals of said first and second MOSFET devices further comprise a common floating plate.

7. The SRAM cell of claim 4, wherein the said common gate conducting material is built into a trench shape site.

8. The SRAM cell of claim 6, wherein the said common floating plate is built into a trench shape site.

9. The SRAM cell of claim 6, wherein at least one of said common floating plate and the said common node A is built into sharp edge.

10. The SRAM cell of claim 8, wherein at least one of said common floating plate and the said common node A is built with sharp edge or edges.

11. The SRAM cell of claim 1, wherein said third and fourth voltage sources are applied by complementary voltage pulses having a predetermined period, wherein said period comprises a pulse width of charge suck period (tp) and a clock width of charge driving period (tc),
wherein the voltage changing period from the voltage level of 'tc' to the voltage level of 'tp' is a period (tpr), wherein tc>>tpr.

12. The SRAM cell of claim 1, wherein the gate terminals of said first and second MOSFET devices are formed by one common gate conducting material.

13. The SRAM cell of claim 12, wherein the gate terminals of said first and second MOSFET devices further comprise a common floating plate.

14. The SRAM cell of claim 12, wherein the said common gate conducting material is built into a trench shape site.

15. The SRAM cell of claim 13, wherein the said common floating plate is built into a trench shape site.

16. The SRAM cell of claim 13, wherein at least one of said common floating plate and the said common gate conducting material is built with sharp edge.

17. The SRAM cell of claim 15, wherein one or both of the said common floating plate and the said common gate conducting material, wherein with sharp edge or edges.

18. The SRAM cell of claim 1, further comprising a capacitor connecting between said node A and a fifth voltage source.

19. The SRAM cell of claim 18, wherein the gate terminals of said first and second MOSFET devices are formed by one common gate conducting material.

20. The SRAM of claim 19, wherein the gate terminals of said first and second MOSFET devices further comprise a common floating plate.

21. The SRAM of claim 19, wherein the said common floating plate is built into a trench shape site.

22. The SRAM of claim 18, wherein the said common gate is built into a trench shape site.

23. The SRAM cell of claim 18, wherein said capacitor connecting between said node A and said fifth voltage source comprises a common floating plate.

24. The cell of claim 18, wherein said capacitor further comprises a floating plate.

25. An SRAM cell addressable for a first word line and first and second bit lines, comprising:
a first MOSFET device of a first conductivity type substrate, having source, drain and gate terminals,
wherein the source terminal is connected to a first voltage source;
wherein said substrate is connected to a second voltage source;
a second MOSFET device of a second conductivity type substrate, having source, drain and gate terminals,
wherein the gate terminals of said first and second MOSFET devices are connected to form a common node A,
wherein the drain terminal of said first MOSFET device is connected to the source terminal of said second MOSFET,
wherein the drain terminal of said second MOSFET is connected to a second voltage source,
wherein the substrate of said second MOSFET is connected to said first voltage source,
wherein the drain terminal of the first MOSFET device and the source terminal of the second MOSFET device are connected to form a common node B;
a third MOSFET of said first conductive type substrate, having source, drain and gate terminals,
wherein one of the source and drain terminals of said third MOSFET is connected to said node A, wherein the gate terminal of said third MOSFET is connected to said first word line,
wherein the other one of the source and drain terminals of said third MOSFET is connected to said first bit line,
wherein the substrate of said third MOSFET is connected to said second source voltage source;
a resister being connected between said node A and node B;
a first capacitor,
wherein one of its terminals is connected to a third voltage source P1,
wherein the other one of its terminals is connected to said node B;
a second capacitor,
wherein one of its terminals is connected to a fourth voltage source P2,
wherein the other one of its terminals being connected to said node B; and
a fourth MOSFET of said first conductive type substrate, having source, drain and gate terminals,
wherein one of the source and drain terminals of said fourth MOSFET is connected to said node B,
wherein the gate terminal of said fourth MOSFET is connected to said word line,
wherein the other one of the source and drain terminals of said fourth MOSFET is connected to said second bit line,
wherein the substrate of said fourth MOSFET is connected to said second source voltage source.

26. The SRAM cell of claim 25, wherein the first voltage source is variable.

27. The SRAM cell of claim 25, further comprising:
a second word line;
a second bit line;
a fourth MOSFET of said first conductive type substrate, having source, drain and gate terminals,
wherein one of the source and drain terminals of said fourth MOSFET is connected to said node B,
wherein the gate terminal of said fourth MOSFET is connected to said second word line,
wherein the other one of the source and drain terminals of said fourth MOSFET is connected to said second bit line,
wherein the substrate of said fourth MOSFET is connected to said second source voltage source.

28. The cell of claim 27, wherein said first voltage source is variable.

29. The SRAM cell of claim 27, wherein the gate of said first MOSFET device further comprises a floating plate.

30. The SRAM cell of claim 27, wherein the gate terminal of said second MOSFET device further comprises a floating gate.

31. The SRAM cell of claim 27, wherein the gate terminal of said first MOSFET device comprises a floating gate, and the gate of said second MOSFET device comprises a floating gate.

32. The SRAM cell of claim 31, wherein the floating plate of sail first MOSFET device is connected to the floating plate of said second MOSFET device.

33. The SRAM cell of claim 27, further comprising a capacitor connecting between said node A and a fifth voltage source.

34. The cell of claim 27, wherein said third and fourth voltage sources are applied by complementary voltage pulses having, a predetermined period.

35. The SRAM cell of claim 25, wherein the gate terminals of said first MOSFET device further comprises a floating plate.

36. The SRAM cell of claim 25, wherein the gate terminal of said second MOSFET device further comprises a floating gate.

37. The SRAM cell of claim 25, further comprising a capacitor connecting between said node A and a fifth voltage source.

38. The cell of claim 25, wherein said third and fourth voltage sources are applied by complementary voltage pulses having a predetermined period.

39. A SRAM cell addressable by a word line and a bit line, comprising:

a first MOSFET device of a first conductivity type substrate, having source, drain and gate terminals, wherein said source terminal is connected to a first voltage source, wherein said substrate is connected to a second voltage source;

a second MOSFET device of a second conductivity type substrate, having source, drain and gate terminals, wherein the gate terminals of said first and second MOSFET devices are connected to form a common node A, wherein the drain terminal of the first MOSFET device is and the source terminal of the second MOSFET device are connected to form a common node B;

wherein the substrate of said second MOSFET device is connected to the first voltage source, wherein the drain terminal of said second MOSFET is connected to said second voltage source;

a third MOSFET of said first conductive type substrate, having source, drain and gate terminals, wherein one of the source and drain terminals of said third MOSFET is connected to said node B, wherein the gate terminal of said third MOSFET is connected to said word line, wherein the other one of the source and drain terminals of said third MOSFET is connected to said bit line, wherein the substrate of said third MOSFET is connected to said second voltage source;

a fourth MOSFET having its source and drain terminals connected between said node A and node B, wherein said fourth MOSFET's gate terminal is connected to a charging control;

a first capacitor, wherein one of its terminals is connected to a third voltage source P1, wherein the other one of its terminals is connected to said node B;

a second capacitor, wherein one of its terminals is connected to a fourth voltage source P2, wherein the other one of its terminals is connected to said node B.

40. The cell of claim 39, wherein said first voltage source is a variable voltage source.

41. The cell of claim 39, wherein said first voltage source is a constant voltage.

42. The cell of claim 39, wherein said third and fourth voltage sources are applied by complementary voltage pulses having a predetermined period.

43. The SRAM cell of claim 39, wherein the gate terminals of said first MOSFET device comprises a floating gate, and the gate terminal of said second MOSFET device comprises a floating gate.

44. The SRAM cell of claim 43, wherein the floating plate of sail first MOSFET device is connected to the floating plate of said second MOSFET device.

45. The SRAM cell of claim 39, wherein the gate terminal of said first MOSFET device further comprises a floating plate.

46. The SRAM cell of claim 39, wherein the gate terminal of said second MOSFET device further comprises a floating gate.

47. The SRAM cell of claim 39, wherein the gate terminal of said first MOSFET device comprises a floating gate, and the gate of said second MOSFET device comprises a floating gate.

48. The SRAM cell of claim 47, wherein the floating plate of sail first MOSFET device is connected to the floating plate of said second MOSFET device.

49. The SRAM cell of claim 39, further comprising a capacitor connecting between said node A and a fifth voltage source.

* * * * *